US011735411B2

(12) United States Patent
Yamamoto et al.

(10) Patent No.: US 11,735,411 B2
(45) Date of Patent: Aug. 22, 2023

(54) METHOD AND APPARATUS FOR MANUFACTURING SEMICONDUCTOR DEVICE (71) Applicant: OKAMOTO MACHINE TOOL WORKS, LTD., Gunma (JP)

(72) Inventors: Eiichi Yamamoto, Gunma (JP); Takahiko Mitsui, Gunma (JP); Tsubasa Bando, Gunma (JP)

(73) Assignee: OKAMOTO MACHINE TOOL WORKS, LTD., Gunma (JP)

( * ) Notice: Subject to any disclaimer, the term of this patent is extended or adjusted under 35 U.S.C. 154(b) by 511 days.

(21) Appl. No.: 16/541,771

(22) Filed: Aug. 15, 2019

(65) Prior Publication Data
US 2020/0066507 A1 Feb. 27, 2020

(30) Foreign Application Priority Data

Aug. 21, 2018 (JP) .................. 2018-154786

(51) Int. Cl.
*H01L 21/02* (2006.01)
*B24B 9/06* (2006.01)
(Continued)

(52) U.S. Cl.
CPC ........ *H01L 21/02021* (2013.01); *B24B 7/228* (2013.01); *B24B 9/065* (2013.01);
(Continued)

(58) Field of Classification Search
CPC ........... B24B 7/228; B24B 7/04; B24B 9/065; B24B 1/04; B24B 35/00; H01L 21/67092; H01L 21/6838; H01L 21/68764
(Continued)

(56) References Cited

U.S. PATENT DOCUMENTS 4,261,781 A * 4/1981 Edmonds ............ H01L 23/4926
438/458
4,344,260 A * 8/1982 Ogiwara ................. B24B 9/065
257/E21.237
(Continued)

FOREIGN PATENT DOCUMENTS

CN 108335976 A 7/2018
JP 58-82660 A 5/1983
(Continued)

OTHER PUBLICATIONS

Japanese Office Action (JPOA) dated Jan. 10, 2023 for Japanese Patent Application No. 2018-154786.

*Primary Examiner* — Joel D Crandall
*Assistant Examiner* — Robert F Neibaur
(74) *Attorney, Agent, or Firm* — Rankin, Hill & Clark LLP (57) ABSTRACT A method for manufacturing a semiconductor device includes chucking in which a semiconductor device wafer is attached to an upper surface of a chuck mechanism with its device surface down; and edge trimming performed after the chucking, wherein the edge trimming comprises: rotating the semiconductor device water horizontally by the chuck mechanism; rotating a rotating blade horizontally by a vertical spindle to which an ultrasonic wave is applied and trimming a circumferential side surface of the semiconductor device wafer by the rotating blade.

2 Claims, 5 Drawing Sheets (51) Int. Cl.
  *H01L 21/67* (2006.01)
  *B24B 7/22* (2006.01)
  *H01L 21/683* (2006.01)
  *H01L 21/687* (2006.01)
(52) U.S. Cl.
  CPC .. *H01L 21/02013* (2013.01); *H01L 21/67092* (2013.01); *H01L 21/6838* (2013.01); *H01L 21/68764* (2013.01)
(58) Field of Classification Search
  USPC ....... 451/121, 123, 158, 246, 254, 258, 285, 451/289, 290, 398, 442, 910
  See application file for complete search history.

(56) References Cited

U.S. PATENT DOCUMENTS

| | | | |
|---|---|---|---|
| 5,658,189 A * | 8/1997 | Kagamida | B24B 41/02 |
| | | | 451/194 |
| 6,110,391 A * | 8/2000 | Takei | H01L 21/76251 |
| | | | 216/33 |
| 6,428,397 B1 * | 8/2002 | Stocker | B24B 55/04 |
| | | | 451/146 |
| 8,679,944 B2 | 3/2014 | Broekaart et al. | |
| 8,796,820 B2 | 8/2014 | Nemoto et al. | |
| 9,437,439 B2 * | 9/2016 | Priewasser | H01L 21/6835 |
| 10,361,102 B2 | 7/2019 | Kaminaga et al. | |
| 10,685,863 B2 * | 6/2020 | Seddon | B24B 7/228 |
| 2011/0097874 A1 * | 4/2011 | Broekaart | H01L 25/50 |
| | | | 438/692 |
| 2011/0165823 A1 | 7/2011 | Ide et al. | |
| 2012/0187547 A1 | 7/2012 | Nemoto et al. | |
| 2013/0115861 A1 | 5/2013 | Priewasser | |
| 2018/0211851 A1 | 7/2018 | Kaminaga et al. | |

FOREIGN PATENT DOCUMENTS

| | | |
|---|---|---|
| JP | H09-168947 A | 6/1997 |
| JP | H09-216152 A2 | 8/1997 |
| JP | 2002-321143 A | 11/2002 |
| JP | 2009-039808 A | 2/2009 |
| JP | 2010-205861 A | 9/2010 |
| JP | 2011-142201 A | 7/2011 |
| JP | 2011-524083 A | 8/2011 |
| JP | 2012-74545 A | 4/2012 |
| JP | 2012-156246 A | 8/2012 |
| JP | 2013-102026 A | 5/2013 |
| JP | 2014-53350 A | 3/2014 |
| JP | 2017-177251 A | 10/2017 |
| JP | 2018-49973 A | 3/2018 |
| JP | 2018-58129 A | 4/2018 |
| JP | 2018-126967 A | 8/2018 |

* cited by examiner

FIG. 5D ical Field

An embodiment of the present disclosure relates to a method and an apparatus for manufacturing a semiconductor device.

2. Related Art

In manufacturing a semiconductor device, it is required to package a semiconductor device water thinner. Specifically, a thickness of the semiconductor device wafer is desired to be 50 μm or less. The most advanced technology has also realized the semiconductor device wafer of 10 μm thickness.

Thinning of the semiconductor device wafer is performed by a grinding technique using a fixed abrasive grinding wheel. When thinning the semiconductor device wafer, chipping at a water edge reduces yield of semiconductor device chips.

A main factor causing chipping at the wafer edge is that the grinding wheel collides with a knife edge of the semiconductor device wafer in a thinning step. Therefore, in order to suppress chipping of the semiconductor device wafer, it is conventionally known to trim (chamfer) the wafer edge before grinding for thinning.

For example, JP-A-2009-039808 discloses that edge grinding (chamfering) of a semiconductor substrate is performed using a cup wheel type diamond grinding wheel. In the edge grinding of the same literature, the diamond grinding wheel rotating horizontally with respect to the semiconductor substrate rotating horizontally is used. Specifically, the diamond grinding wheel rotating horizontally is lowered from above so that a vertical surface of an outer peripheral edge of the diamond grinding wheel overlaps a vertical surface of an outer peripheral edge of the semiconductor substrate, to make a grinding cut on an edge surface of the semiconductor substrate.

JP-A-2011-142201 discloses an edge grinding process of the semiconductor substrate using a diamond edge grinding wheel rotating vertically about a horizontal axis. In the edge grinding process of the same literature, the edge grinding wheel rotating vertically is lowered toward the outer peripheral edge of the semiconductor substrate rotating horizontally. This reduces a thickness of the outer peripheral edge of the semiconductor substrate to a desired thickness.

JP-A-09-216152 discloses an end grinding apparatus. In the end grinding apparatus, a diamond wheel is rotated vertically by a spindle disposed in a Y-axis direction (horizontal direction). An outer peripheral portion of the semiconductor wafer is ground by bringing an outer peripheral surface of the diamond wheel rotating vertically into contact with the outer peripheral portion of the semiconductor wafer rotating horizontally.

There are conventionally known to attach a back grind tape (BG tape) as a grinding protective layer to a device surface of the semiconductor device wafer, and wafer support system (WSS) in which a support wafer is formed through a resin on the device surface of the semiconductor device wafer.

A conventional trimming process is generally performed by a method for removing a part of an edge portion of the device surface of the semiconductor device wafer by a diamond blade. Next, the BG tape is attached to the device surface of the semiconductor device wafer, or the support wafer by the SUSS is formed on the device surface. Thereafter, a back surface of the semiconductor device wafer is removed by grinding. Thus, the thinning of the semiconductor device wafer is performed.

SUMMARY

A method for manufacturing a semiconductor device includes chucking in which a semiconductor device wafer is attached to an upper surface of a chuck mechanism with its device surface down; and edge trimming performed after the chucking, wherein the edge trimming comprises: rotating the semiconductor device wafer horizontally by the chuck mechanism; rotating a rotating blade horizontally by a vertical spindle to which an ultrasonic wave is applied; and trimming a circumferential side surface of the semiconductor device wafer by the rotating blade.

BRIEF DESCRIPTION OF THE DRAWINGS

FIGS. 3A to 3D are views showing a method for manufacturing the semiconductor device according to an embodiment of the present disclosure;

FIGS. 4A and 4B are views showing a portion near a trimming surface according to the embodiment of the present disclosure;

FIGS. 5A to 5D are views showing a method for manufacturing the semiconductor device according to another embodiment of the present disclosure;

DESCRIPTION OF THE EMBODIMENTS

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

As described above, in the field of semiconductor devices, further thinning of the semiconductor device wafer is required. In order to realize this, there is a need for a highly accurate trimming technique for suppressing chipping of the semiconductor device wafer.

However, it is difficult for the above-described related arts to realize a highly accurate and highly efficient edge trimming step for suppressing chipping of the semiconductor device wafer.

Specifically, the method for trimming the edge by a cup wheel type diamond grinding wheel, which is one of the above-described related arts, has a low processing speed and lacks productivity. Further, when the cup wheel type diamond grinding wheel is worn out, verticality of trimming bottom surface is lost and the trimming bottom surface becomes tapered.

In the method for trimming by pressing a diamond blade rotating vertically against an edge portion of the semiconductor device wafer rotating horizontally, the diamond blade and the semiconductor device wafer are in line contact with each other. Therefore, shear stress on the semiconductor device wafer is large.

Therefore, in the method for forming a support wafer through a resin on the device surface of the semiconductor device wafer by WSS, if attachment of the WSS is not complete, the shear stress by the diamond blade has sometimes caused new defects in the semiconductor device wafer and/or the WSS.

Further, in the method for removing the edge portion of the device surface of the semiconductor device wafer by the diamond blade, attachment of a BG tape or formation of the support wafer by the WSS is performed in a state in which a step is formed on an outer periphery of the device surface. Therefore, variation in thickness of the semiconductor device wafer is likely to occur in a thinning step.

Further, in the method for trimming the device surface of the semiconductor device wafer described above, it is necessary to remove the semiconductor wafer such as silicon (Si) located below a metal film and an insulating film, which are difficult to process, via the metal film and the insulating film. Therefore, wear of the diamond blade is increased.

Further, in the method for trimming the device surface of the semiconductor device wafer described above, scattered dust and contaminants easily adhere to the device surface. Therefore, the process cost increases due to, for example, a requirement of precision cleaning.

An object of the present disclosure is to provide a method and an apparatus for manufacturing a highly productive semiconductor device capable of suppressing chipping of a semiconductor device wafer and capable of highly accurate and efficient trimming.

A method for manufacturing a semiconductor device according to an aspect of the present disclosure includes chucking in which a semiconductor device wafer is attached to an upper surface of a chuck mechanism with its device surface down; and edge trimming performed after the chucking, wherein the edge trimming comprises: rotating the semiconductor device wafer horizontally by the chuck mechanism; rotating a rotating blade horizontally by a vertical spindle to which an ultrasonic wave is applied; and trimming a circumferential side surface of the semiconductor device wafer by the rotating blade.

An apparatus for manufacturing a semiconductor device according to another aspect of the present disclosure includes a chuck mechanism for adsorbing a semiconductor device wafer with its device surface down and rotating it horizontally; a rotating blade which is rotated horizontally by a vertical spindle, to trim a circumferential side surface of the semiconductor device wafer adsorbed by the chuck mechanism and rotated horizontally; and an ultrasonic vibration device for applying an ultrasonic wave to the vertical spindle.

According to the manufacturing method, after the chucking is performed in which the semiconductor device wafer is attached to the upper surface of the chuck mechanism with its device surface down, the edge trimming is performed. The edge trimming includes rotating the semiconductor device wafer horizontally by the chuck mechanism, rotating the rotating blade horizontally by the vertical spindle, and trimming the circumferential side surface of the semiconductor device wafer by the rotating blade. Thus, the circumferential side surface of the semiconductor device wafer can be trimmed in a state where influence of various films such as the metal film and the insulating film formed on the device surface is suppressed.

Specifically, in the edge trimming of the manufacturing method, the rotating blade is rotated horizontally by the vertical spindle to which a ultrasonic wave is applied. Thus, by the edge trimming of the manufacturing method, high speed and high precision trimming can be performed as compared with the trimming by the cup wheel type diamond grinding wheel or the like of the related art. Furthermore, since the wear of the rotating blade is reduced, it is possible to suppress chipping near the trimmed circumferential side surface.

The semiconductor device wafer is trimmed by the rotating blade, which is rotated horizontally and applied with the ultrasonic wave, with its device surface down and attached to the chuck mechanism. Therefore, the device surface of the semiconductor device wafer is not easily contaminated. This eliminates need for precision cleaning, thereby achieving cost reduction of the semiconductor device.

The manufacturing method may include thinning of the semiconductor device wafer by processing a back surface of the semiconductor device wafer by a grinding method using a cup grinding wheel, which is performed after the edge trimming. This makes it possible to perform thinning with small variation in thickness. Therefore, a highly flat and thinned semiconductor device wafer can be obtained.

As the chuck mechanism, a structure can be used in which the device surface is held by attaching the BG tape or attaching the support wafer through the resin by the WSS. Therefore, in the thinning step, the variation in the thickness of the semiconductor device wafer is less likely to occur. In addition, the device surface is protected by the BG tape or the WSS support wafer. Therefore, the device surface is less likely to be contaminated, and the dust is less likely to adhere to the device surface.

According to the manufacturing method, a portion near an outer peripheral grinding wheel surface of the rotating blade used in the edge trimming may be thinner than the semiconductor device wafer. This makes it possible to form a recess extending in a rotational direction in the circumferential side surface of the semiconductor device wafer. This also makes it possible to reduce contamination of the back surface of the semiconductor device wafer. Thus, precise thinning can be performed.

Furthermore, this manufacturing apparatus includes: the chuck mechanism for adsorbing the semiconductor device wafer with its device surface down and rotating it horizontally; the rotating blade which is rotated horizontally by the vertical spindle, to trim the circumferential side surface of the semiconductor device wafer adsorbed by the chuck mechanism and rotated horizontally; and the ultrasonic vibration device for applying the ultrasonic wave to the vertical spindle. This enables highly accurate and efficient trimming of the semiconductor device water. Thus, it is possible to suppress chipping and to improve the productivity.

According to this manufacturing apparatus, the cup grinding wheel for processing the back surface of the semiconductor device wafer trimmed by the rotating blade to thin the semiconductor device wafer may be provided above the chuck mechanism. This makes it possible to planarize the back surface of the semiconductor device wafer with high accuracy, Therefore, further thinning of the semiconductor device wafer can be achieved.

According to this manufacturing apparatus, the vertical spindle may be journaled above and below the rotating blade. This makes it possible to suppress vibration of the rotating blade. As a result, since rotational accuracy of the rotating blade is improved, the trimming can be performed on a very accurate position on the circumferential side surface of the semiconductor device wafer.

Hereinafter, the method and the apparatus for manufacturing the semiconductor device according to an embodiment of the present disclosure will be described in detail with reference to the drawings.

Figure 1:
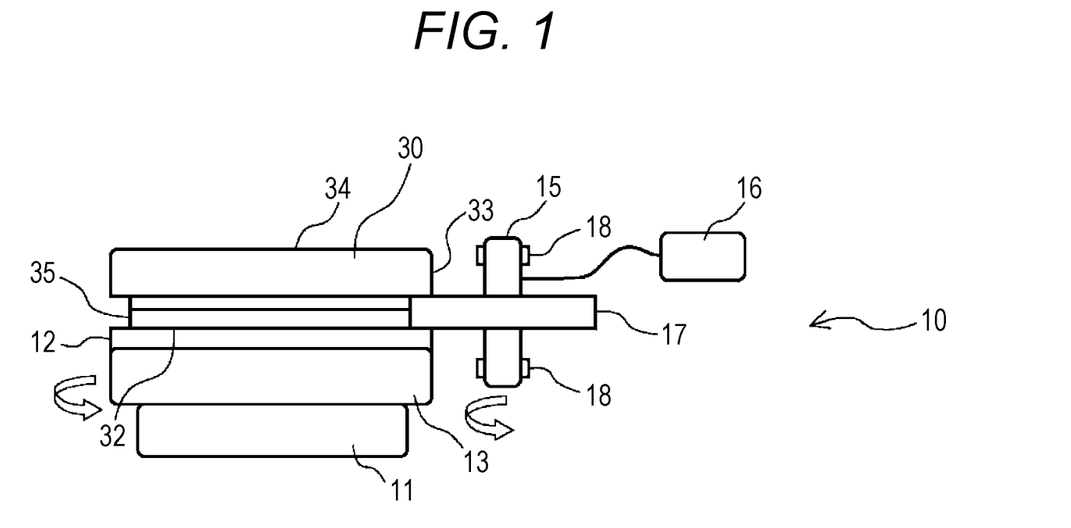
FIG. 1 is a front view showing an edge trimming apparatus of an apparatus for manufacturing a semiconductor device according to an embodiment of the present disclosure.

FIG. 1 is a schematic view showing an apparatus for manufacturing a semiconductor device according to this embodiment, and is a front view showing a schematic structure of an edge trimming apparatus 10. As shown in FIG. 1, the edge trimming apparatus 10 is an apparatus for trimming a circumferential side surface 33 of a semiconductor device wafer 30.

The edge trimming apparatus 10 has a vacuum chuck 11, a vertical spindle 15, a rotating blade 17, and an ultrasonic oscillation device 16. The vacuum chuck 11 supports and horizontally rotates the semiconductor device wafer 30. The rotating blade 17 grinds the circumferential side surface 33 of the semiconductor device wafer 30. The vertical spindle 15 supports the rotating blade 17. The ultrasonic oscillation device 16 applies the ultrasonic wave to the vertical spindle 15. The ultrasonic oscillation device 16 corresponds to an example of the ultrasonic vibration device.

The vacuum chuck 11 constitutes the chuck mechanism for chucking the semiconductor device wafer 30. The vacuum chuck 11 is provided to be horizontally rotatable such that its rotation axis is substantially vertical. The semiconductor device wafer 30 is attached to the upper surface of the vacuum chuck 11 via a holding layer formed of a support substrate 13 and the like. The semiconductor device wafer 30 attached to the vacuum chuck 11 is rotated horizontally along with the chuck mechanism such as the vacuum chuck 11 and the like.

The rotating blade 17 is, for example, a diamond grinding wheel blade including the diamond grinding wheel fixed by vitrified bond. The rotating blade 17 can be rotated horizontally by its central portion being supported by the vertical spindle 15. The rotating blade 17 is provided at a position in which an outer peripheral portion thereof can contact the circumferential side surface 33 of the semiconductor device wafer 30.

The vertical spindle 15 is a rotating shaft supporting the rotating blade 17. The rotating shaft of the vertical spindle 15 extends in a vertical direction. Therefore, the vertical spindle 15 is provided to be horizontally rotatable. The vertical spindle 15 is rotationally driven by a driving device (not shown), and thus the rotating blade 17 is rotated horizontally.

The vertical spindle 15 and the rotating blade 17 are provided horizontally movable toward the semiconductor device wafer 30. Thus, it is possible to bring the rotating blade 17 horizontally rotating close to the semiconductor device wafer 30 which is held by the vacuum chuck 11 and rotated horizontally, and to press the outer peripheral grinding wheel surface of the rotating blade 17 against the circumferential side surface 33 of the semiconductor device wafer 30. Furthermore, it is possible to grind the circumferential side surface 33 of the semiconductor device wafer 30 with high accuracy, and to form a trimming surface 35 having a desired depth, by the outer peripheral grinding wheel surface of the rotating blade 17.

The vacuum chuck 11 for holding the semiconductor device wafer 30 may be movable in a horizontal direction for performing the trimming by pressing the outer peripheral grinding wheel surface of the rotating blade 17 rotating horizontally against the circumferential side surface 33 of the semiconductor device wafer 30 rotating horizontally as described above.

The rotating blade 17 or the vacuum chuck 11 may be movable in the vertical direction. Thus, the trimming can be repeatedly performed while changing the vertical position of the rotating blade 17 with respect to the semiconductor device wafer 30. As a result, the trimming surface 35 can be formed in a desired range in the vertical direction in the circumferential side surface 33 of the semiconductor device wafer 30.

The vertical spindle 15 is journaled by bearings 18 above and below the rotating blade 17. Thus, rotational vibration of the rotating blade 17 is suppressed by the vertical spindle 15 being journaled at two upper and lower positions. As a result, since the rotational accuracy of the rotating blade 17 is improved, the trimming can be performed with high accuracy.

The ultrasonic oscillation device 16 is a device for applying the ultrasonic wave to the vertical spindle 15. When the ultrasonic wave is applied to the vertical spindle 15 by the ultrasonic oscillation device 16, ultrasonic wave is applied to the rotating blade 17, and the rotating blade 17 is ultrasonically vibrated in a rotational radial direction. Thus, the circumferential side surface 33 of the semiconductor device wafer 30 can be trimmed at high speed and with high accuracy. Furthermore, since the ultrasonic wave is applied to the rotating blade 17, the wear of the rotating blade 17 is reduced, Thus, it is possible to suppress the chipping near the trimmed circumferential side surface 33 of the semiconductor device wafer 30.

Figure 2:
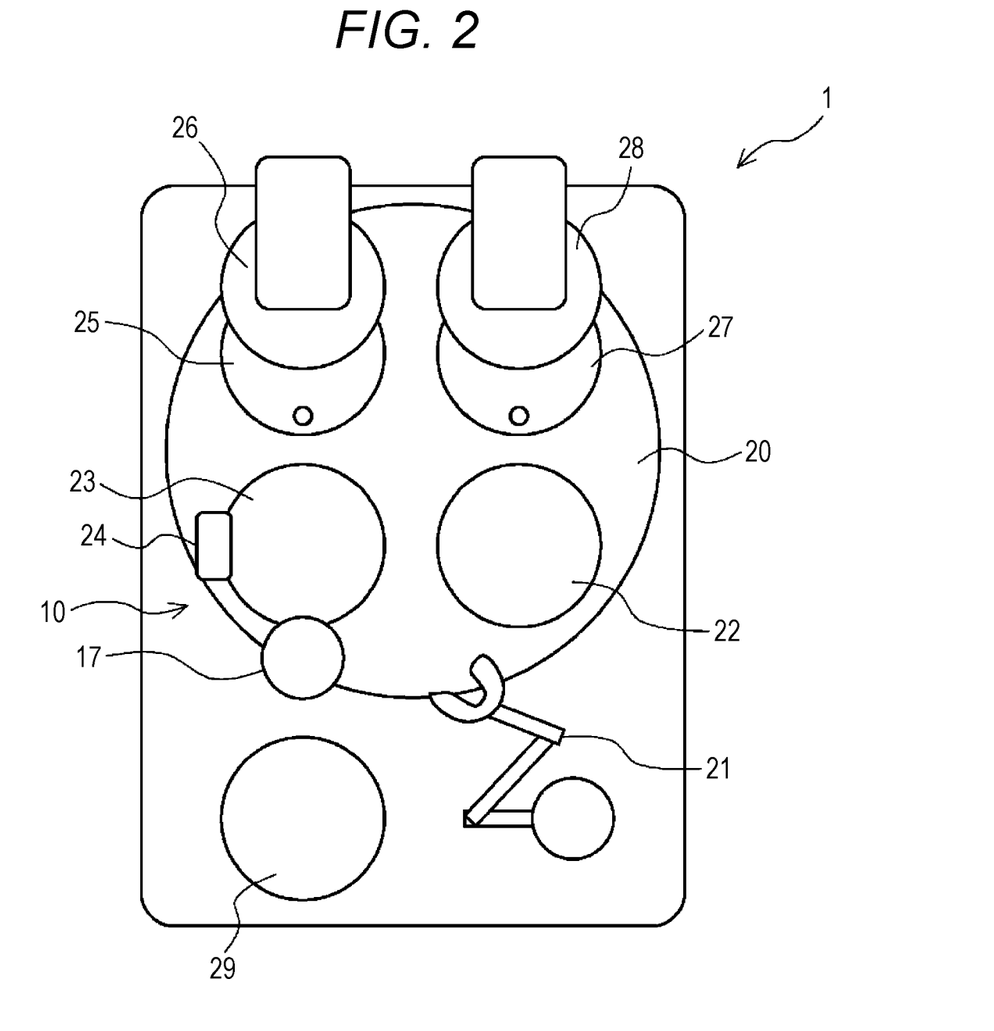
FIG. 2 is a plan view showing the apparatus for manufacturing the semiconductor device according to the embodiment of the present disclosure.

FIG. 2 is a plan view showing the apparatus for manufacturing the semiconductor device, and shows a schematic structure of a fully automatic grinding apparatus 1 in which the edge trimming apparatus 10 is incorporated. As shown in FIG. 2, the fully automatic grinding apparatus 1 is an apparatus which automatically performs a series of steps of a chucking step, the edge trimming step, the thinning step and a cleaning step of the semiconductor device wafer 30 (see FIG. 1).

The fully automatic grinding apparatus 1 has a transfer robot 21 for transferring the semiconductor device wafer 30, a standby table 22 for performing each step, an ultrasonic trimming table 23, a rough grinding table 25, a finish grinding table 27, and a cleaner 29.

The fully automatic grinding apparatus 1 has a 90-degree index feed table 20 on which the tables 22, 23, 25 and 27 are placed. The 90-degree index feed table 20 index-feeds the semiconductor device wafer 30 to the standby table 22, the ultrasonic trimming table 23, the rough grinding table 25 and the finish grinding table 27 by 90 degrees. For example, the 90-degree index feed table 20 rotationally moves semiconductor device wafer 30) by 90 degrees. Thus, the 90-degree index feed table 20 causes the table carrying the semiconductor device wafer 30 to function as the standby table 22, the ultrasonic trimming table 23, the rough grinding table 25, and the finish grinding table 27.

The standby table 22 is a table for performing the chucking step of the semiconductor device wafer 30. The semiconductor device wafer 30 to be processed is first transferred by the transfer robot 21 to the standby table 22. Then, the chucking step of the semiconductor device wafer 30 is performed on the standby table 22.

The ultrasonic trimming table 23 is a table for performing the edge trimming step of the semiconductor device wafer 30. After the chucking step on the standby table 22, the 90-degree index feed table 20 index-feeds the semiconductor device wafer 30 by 90 degrees in a clockwise direction. Thus, the edge trimming step of the semiconductor device wafer 30 is performed on the ultrasonic trimming table 23. Specifically, a part of the circumferential side surface 33 of the semiconductor device wafer 30 is ground by the rotating blade 17 of the edge trimming apparatus 10, which horizontally rotates in a state where the ultrasonic wave is applied.

The fully automatic grinding apparatus 1 includes a trimming shape evaluation device 24. The trimming shape evaluation device 24 accurately detects and evaluates a trimming shape of the semiconductor device wafer 30. Thus, highly accurate trimming is realized.

The rough grinding table 25 and the finish grinding table 27 are tables for performing the thinning step of the semiconductor device wafer 30. A rough grinding head 26 is provided above the rough grinding table 25 for rough grinding an upper surface of the semiconductor device wafer 30. Furthermore, a finish grinding head 28 for finish grinding the upper surface of the semiconductor device wafer 30 is provided on an upper surface of the finish grinding table 27.

On the ultrasonic trimming table 23, the semiconductor device wafer 30 for which the edge trimming step has been completed is further index-ted clockwise by 90 degrees by the 90-degree index feed table 20. Then, rough grinding for thinning by the rough grinding head 26 is performed on the rough grinding table 25.

Then, the semiconductor device wafer 30 roughly ground by the rough grinding table 25 is index-fed to the finish grinding table 27 by the 90-degree index feed table 20. The semiconductor device wafer 30 is finish-ground to a final thickness by the finish grinding head 28.

The semiconductor device wafer 30 thinned on the finish grinding table 27 is returned to the standby table 22 on the 90-degree index feed table 20. Thereafter, the semiconductor device wafer 30 is transferred to the cleaner 29 by the transfer robot 21. Then, the cleaning step of cleaning the semiconductor device wafer 30 is performed in the cleaner 29.

The fully automatic grinding apparatus 1 shown in FIG. 2 is only an example of the apparatus for manufacturing the semiconductor device according to the present embodiment. For example, the edge trimming apparatus 10 can be separated from the fully automatic grinding apparatus 1 to realize a single fully automatic trimming apparatus.

Furthermore, the edge trimming apparatus 10 may be provided at a portion in which the cleaner 29 is disposed as shown in FIG. 2. Thus, it is possible to obtain an automatic grinding apparatus with the edge trimming apparatus 10 having the edge trimming apparatus 10 separated from grinding stages of the rough grinding table 25 and the finish grinding table 27.

Next, a method for manufacturing the semiconductor device according to the present embodiment will be described in detail.

Figure 3A:
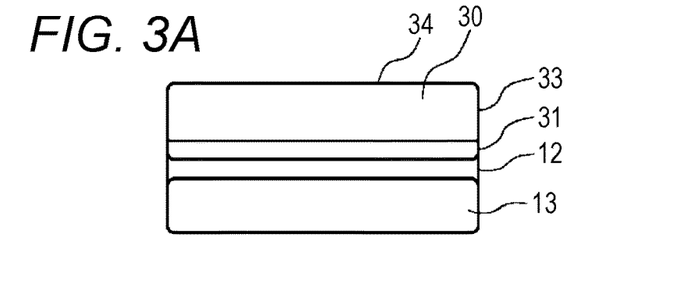
FIG. 3A is a view showing a state in which a semiconductor device wafer is prepared in a chucking step.
Figure 3B:
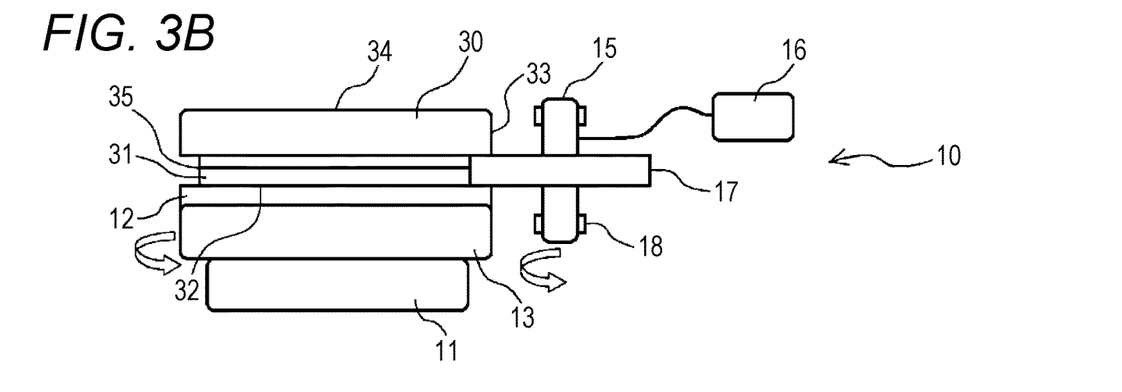
FIG. 3B is a view showing a state in which trimming is performed in an edge trimming step.
Figure 3C:
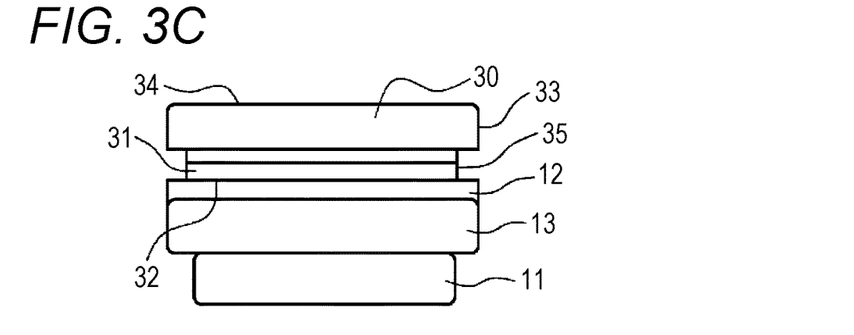
FIG. 3C is a view showing a state in which the edge trimming step is completed.
Figure 3D:
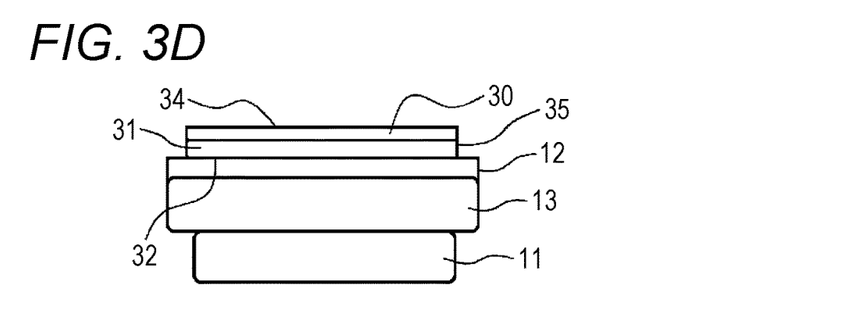
FIG. 3D is a view showing a state in which thinning is performed in a thinning step.

FIGS. 3A to 3D are views showing a method for manufacturing the semiconductor device. FIG. 3A is a view showing a state in which the semiconductor device wafer 30 is prepared in the chucking step. FIG. 3B is a view showing a state in which the trimming is performed in the edge trimming step. FIG. 3C is a view showing a state in which the edge trimming step is completed. FIG. 3D is a view showing a state in which the thinning is performed in the thinning step.

Referring to FIG. 3A, the semiconductor device wafer 30 is a silicon wafer on which a semiconductor device layer 31 is formed. The semiconductor device wafer 30 has, for example, a diameter of 300 mm and a thickness of 775 μm.

In the chucking step, the support substrate 13 which is a silicon-based support wafer is bonded to a device surface 32 of the semiconductor device wafer 30 via a bonding resin layer 12 formed of a silicone-based resin by WSS method. A thickness of the bonding resin layer 12 is, for example, 40 μm, and a thickness of the support substrate 13 is, for example, 750 μm.

Next, as shown in FIG. 3B, the semiconductor device wafer 30 is held by the vacuum chuck 11 via the bonding resin layer 12 and the support substrate 13 with the device surface 32 down.

Then, the edge trimming step is performed on the ultrasonic trimming table 23 (see FIG. 2). In the edge trimming step, the semiconductor device wafer 30 is horizontally rotated by the vacuum chuck 11. Furthermore, the outer peripheral grinding wheel surface of the rotating blade 17, which is also horizontally rotated and to which the ultrasonic wave is applied, is pressed against the circumferential side surface 33 of the semiconductor device wafer 30. Thus, the circumferential side surface 33 of the semiconductor device wafer 30 is trimmed.

Note that an upper portion of the bonding resin layer 12 may be ground together with the circumferential side surface 33 by the rotating blade 17. Thus, it is possible to enhance an effect of suppressing chipping of the semiconductor device wafer 30.

Here, the rotating blade 17 has, for example, a diameter of 100 mm and an outer peripheral grinding wheel surface thickness of 0.15 mm. A particle size of the diamond grinding wheel of the rotating blade 17 is preferably #240 to #8000, more preferably #1000 to #3000, and most preferably #2000.

The number of revolutions of the rotating blade 17 in the edge trimming step is preferably 8000 to 12000 min$^{-1}$. The number of revolutions of the semiconductor device wafer 30 is preferably 250 to 350 min$^{-1}$. A horizontal movement speed of the vertical spindle 15 is preferably 0.3 to 0.7 mm/min.

For example, the trimming is performed for 3 minutes by setting the number of revolutions of the rotating blade 17 to 10000 min$^{-1}$, the number of revolutions of the semiconductor device wafer 30 to 300 min$^{-1}$, and the horizontal movement speed of the vertical spindle 15 to 0.5 mm/min, so that the trimming surface 35 is processed to a depth of 1.5 mm from the circumferential side surface 33. The semiconductor device wafer 30 with a surface roughness of 15 to 20 nm (Ra) is obtained by the trimming under the above conditions.

As described above, in the edge trimming step, since the rotating blade 17 is horizontally rotated by the vertical spindle 15 to which the ultrasonic wave is applied, the trimming is performed at high speed and high accuracy as compared to the trimming using the cup wheel type diamond grinding wheel or the like according to the related art. Furthermore, since the ultrasonic wave is applied to the rotating blade 17 rotating horizontally, the wear of the rotating blade 17 is reduced. Thus, it is possible to suppress the chipping near the trimmed circumferential side surface 33.

Frequency of the ultrasonic wave applied from the ultrasonic oscillation device 16 to the vertical spindle 15 is preferably 16 to 1000 kHz, more preferably 20 to 100 kHz, and most preferably 40 kHz. Thus, it is possible to obtain trimming performance suitable for the semiconductor device wafer 30.

Furthermore, the semiconductor device wafer 30 is trimmed by the rotating blade 17, which is horizontally rotated and to which the ultrasonic wave is applied, while being held by the vacuum chuck 11 with the device surface 32 down. Therefore, the device surface 32 is less likely to be contaminated. This eliminates the need for precision cleaning, thereby achieving cost reduction of the semiconductor device. Furthermore, the circumferential side surface 33 of the semiconductor device wafer 30 can be trimmed in a state where the influence of various films such as the metal film and the insulating film formed on the device surface 32 is suppressed.

The trimming surface 35 is formed on the circumferential side surface 33 of the semiconductor device wafer 30 by the edge trimming step. Specifically, the portion near the outer peripheral grinding wheel surface of the rotating blade 17 is thinner than the semiconductor device wafer 30. Therefore, as shown in FIG. 3C, the trimming surface 35 is recessed from the circumferential side surface 33, to form a circumferential recess extending in a rotation direction of the semiconductor device wafer 30.

Since the recessed trimming surface 35 is formed on the circumferential side surface 33 of the semiconductor device wafer 30 in the edge trimming step, it is possible to reduce contamination of a back surface 34 of the semiconductor device wafer 30. Thus, the precise thinning can be performed in the next thinning step.

After the edge trimming step is performed, the thinning step is sequentially performed on the rough grinding table 25 (see FIG. 2) and the finish grinding table 27 (see FIG. 2). In the thinning step, the back surface 34 of the semiconductor device wafer 30 is ground by the grinding method using the cup grinding wheel (not shown) As a result, the semiconductor device wafer 30 is thinned as shown in FIG. 3D.

The cup grinding wheel used in the thinning step is, for example, a cup wheel type grinding wheel having diamond abrasive particles of particle size #240 to #8000. In the rough grinding, the abrasive particles of the cup grinding wheel may be large and the number of revolutions may be low. On the other hand, in the finish grinding, the abrasive particles of the cup grinding wheel may be small and the number of revolutions may be high.

By performing the thinning step after the edge trimming step, it is possible to perform the thinning with small variation in thickness, Therefore, a highly flat and thin semiconductor device wafer 30 can be obtained. As the chuck mechanism, a configuration in which the device surface 32 of the semiconductor device wafer 30 is held can be used by bonding the support substrate 13 via the bonding resin layer Therefore, the variation in thickness of the semiconductor device wafer 30 is less likely to occur in the thinning step. Furthermore, the device surface 32 is protected by the support substrate 13. Therefore, the device surface 32 is less likely to be contaminated, and the dust is less likely to adhere to the device surface 32.

Figure 4A:
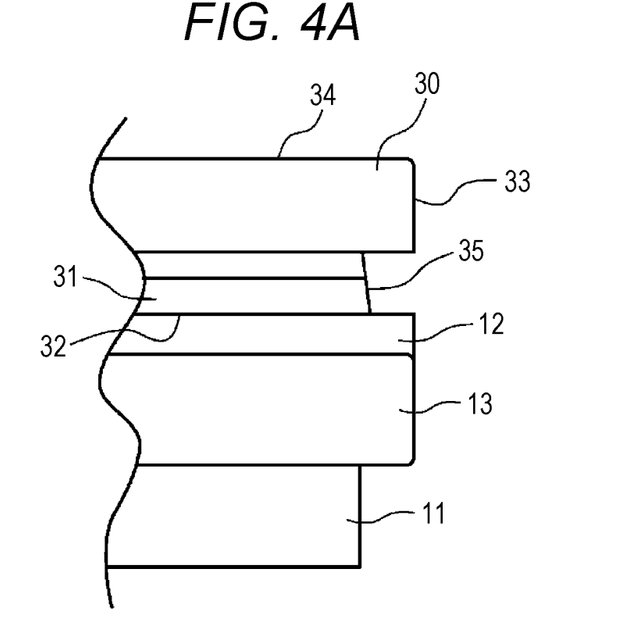
FIG. 4A is a view showing a state in which the edge trimming step is completed.
Figure 4B:
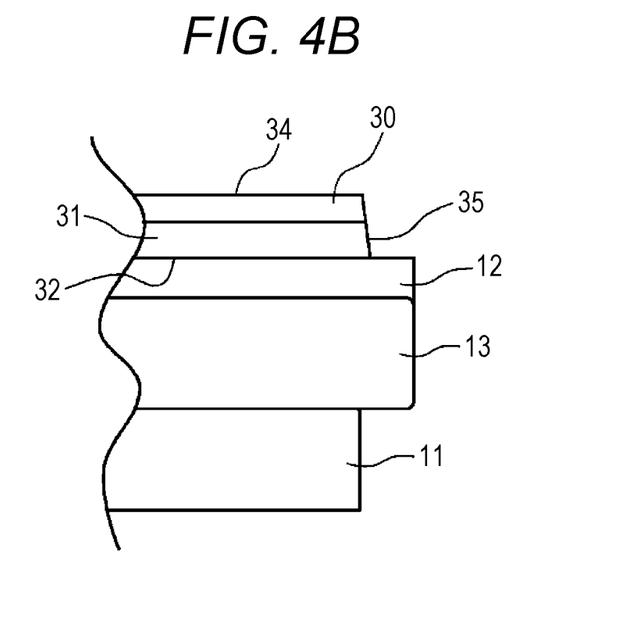
FIG. 4B is a view showing a state in which the thinning is performed in the thinning step.

FIGS. 4A and 4B are views showing a portion near the trimming surface 35 of the semiconductor device wafer 30. FIG. 4A is a view showing a state in which the edge trimming step is completed. FIG. 4B is a view showing a state in which thinning is performed in the thinning step.

As shown in FIGS. 4A and 4B, the recessed trimming surface 35 formed on the circumferential side surface 33 may be formed in a substantially truncated cone shape having an upper diameter smaller a lower diameter. Specifically, an angle between the device surface 32 and the inclined trimming surface 35 is 70 to 90 degrees, and preferably about 80 degrees. Since the trimming surface 35 inclined to have the reduced upper diameter is formed, the chipping of the semiconductor device wafer 30 can be further reduced.

Figure 5A:
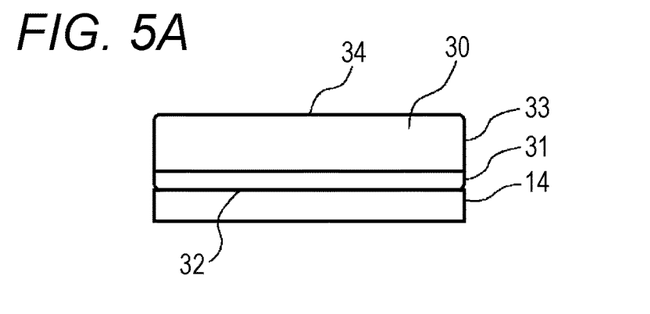
FIG. 5A is a view showing a state in which the semiconductor device wafer is prepared in the chucking step.
Figure 5B:
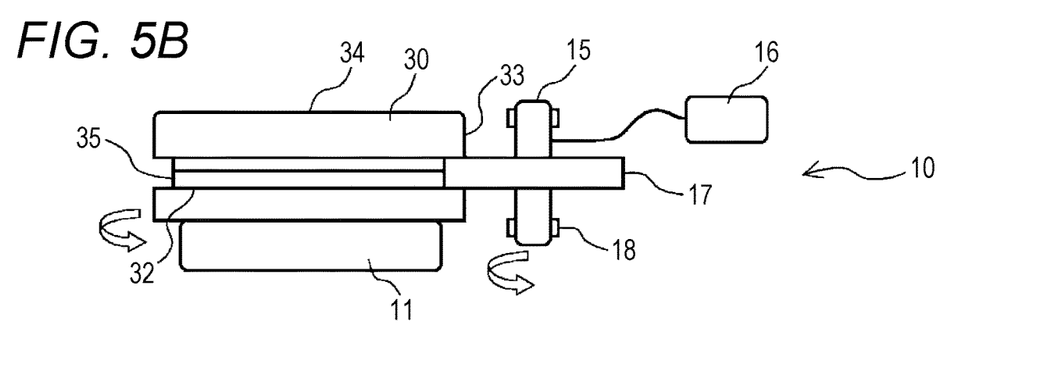
FIG. 5B is a view showing a state in which the trimming is performed in the edge trimming step.
Figure 5C:
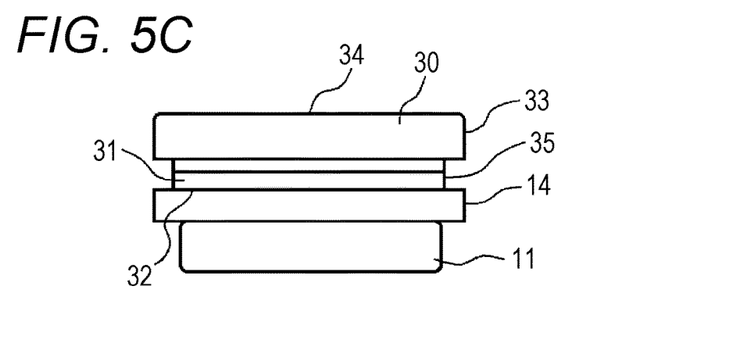
FIG. 5C is a view showing a state in which the edge trimming step is completed.
Figure 5D:
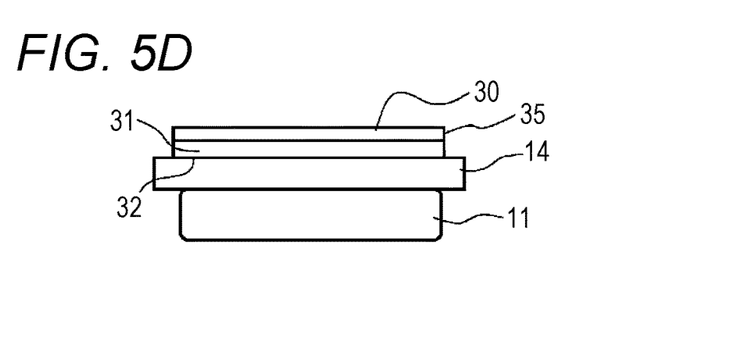
FIG. 5D is a view showing a state in which the thinning is performed in the thinning step.

FIGS. 5A to 5D are views showing another example of the method for manufacturing the semiconductor device. FIG. 5A is a view showing a state in which the semiconductor device wafer 30 is prepared in the chucking step. FIG. 5B is a view showing a state in which the trimming is performed in the edge trimming step. FIG. 5C is a view showing a state n which the edge trimming step is completed. FIG. 5D is a view showing a state in which the thinning is performed in the thinning step. Note that the same reference numerals are denoted to components exhibiting the same or similar operation and effect as in the embodiment already described.

Referring to FIG. 5A, in the chucking step, a protective tape 14 which is a BG tape is bonded to device surface 32 of semiconductor device wafer 30. As the protective tape 14, for example, UV tape E8180 with a thickness of 180 μm manufactured by Lintec Corporation is used.

Then, as shown in FIG., 5B, the semiconductor device wafer 30 is held by the vacuum chuck 11 via the protective tape 14 with the device surface 32 down.

Next, in the trimming step, the semiconductor device wafer 30 is trimmed by the rotating blade 17 which is horizontally rotated and to which the ultrasonic wave is applied. As shown in FIG. 5C, the recess due to the trimming surface 35 is formed in the circumferential side surface 33.

After the edge trimming step is performed, the thinning step of grinding the back surface 34 is performed. Thus, as shown in FIG. 5D, the highly flat and thin semiconductor device wafer 30 with little variation in thickness can be obtained.

The embodiments of the present disclosure are not limited to the above-described embodiments, and various modifications can be made without departing from the scope of the present disclosure.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. An apparatus for manufacturing a semiconductor device, comprising:
    a chuck mechanism for adsorbing a semiconductor device wafer via a bonding resin layer and a support substrate with the semiconductor device surface down and rotating the semiconductor device horizontally, the support substrate being bonded to the semiconductor device surface of the semiconductor device wafer via the bonding resin layer;
    a rotating blade which is rotated horizontally by a vertical spindle, to grind a circumferential edge surface of the semiconductor device wafer and an upper portion of the bonding resin layer adsorbed by the chuck mechanism and rotated horizontally; and
    an ultrasonic vibration device for applying an ultrasonic wave to the vertical spindle to vibrate the rotating blade in a rotational radial direction, wherein an outer peripheral grinding wheel surface of the rotating blade is thinner than the semiconductor device wafer, the vertical spindle is journaled by bearings provided in the upper and lower portions of the vertical spindle, and the rotating blade is connected to the vertical spindle between the bearings provided in the upper portion and the lower portion of the vertical spindle.

2. The apparatus for manufacturing the semiconductor device according to claim 1, wherein a cup grinding wheel for processing a back surface of the semiconductor device wafer grinded by the rotating blade to thin the semiconductor device wafer is provided above the chuck mechanism.

\* \* \* \* \*